United States Patent
Lim

(10) Patent No.: US 8,797,068 B2
(45) Date of Patent: Aug. 5, 2014

(54) INPUT/OUTPUT SENSE AMPLIFIER AND SEMICONDUCTOR APPARATUS INCLUDING THE SAME

(75) Inventor: Kyu Nam Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 14 days.

(21) Appl. No.: 13/611,167

(22) Filed: Sep. 12, 2012

(65) Prior Publication Data

US 2013/0293300 A1 Nov. 7, 2013

(30) Foreign Application Priority Data

May 4, 2012 (KR) .................... 10-2012-0047467

(51) Int. Cl.
*G01R 19/00* (2006.01)
*G01C 7/00* (2006.01)
*H03F 3/45* (2006.01)

(52) U.S. Cl.
USPC .......................................................... 327/52

(58) Field of Classification Search
USPC ..................................... 327/51–55
See application file for complete search history.

(56) References Cited

U.S. PATENT DOCUMENTS

| | | | | |
|---|---|---|---|---|
| 5,155,397 A | * | 10/1992 | Fassino et al. | 327/54 |
| 5,872,465 A | * | 2/1999 | Saitoh | 327/54 |
| 5,920,208 A | * | 7/1999 | Park | 327/54 |
| 6,297,682 B1 | * | 10/2001 | Morishima | 327/327 |
| 7,554,866 B2 | * | 6/2009 | Moon et al. | 365/205 |
| 2007/0070709 A1 | * | 3/2007 | Shin | 365/189.01 |
| 2011/0012643 A1 | * | 1/2011 | Jain et al. | 327/52 |

FOREIGN PATENT DOCUMENTS

KR 10-2007-0036569 A 4/2007
KR 10-2008-0102038 A 11/2008

\* cited by examiner

*Primary Examiner* — Quan Tra
(74) *Attorney, Agent, or Firm* — William Park & Associates Patent Ltd.

(57) ABSTRACT

An input/output sense amplifier is configured to amplify data inputted through a pair of local transmission lines in response to a sense amplifier enable signal and a test mode signal, output the data through a global transmission line, generate a control signal by sensing whether the data have been amplified, and halt amplification of the data in response to the control signal when amplification is completed.

31 Claims, 3 Drawing Sheets

INPUT/OUTPUT SENSE AMPLIFIER AND SEMICONDUCTOR APPARATUS INCLUDING THE SAME

CROSS-REFERENCES TO RELATED APPLICATION

The present application claims priority under 35 U.S.C. §119(a) to Korean application number 10-2012-0047467, filed on May 4, 2012, in the Korean Intellectual Property Office, which is incorporated herein by reference in its entirety.

BACKGROUND

1. Technical Field

The present invention relates generally to a semiconductor apparatus, and particularly, to an input/output sense amplifier which senses and amplifies data on input/output lines.

2. Related Art

In a read operation of a semiconductor apparatus, a circuit for data transmission between a local transmission line (LIO) which receives the output of a bit line sense amplifier and a global transmission line (GIO) which transmits the output of the bit line sense amplifier to an external component is needed. Thus, an input/output sense amplifier (IOSA) is used to transmit the data loaded on the local transmission line (LIO) to the global transmission line (GIO) in the read operation.

FIG. 1 is a configuration diagram of a conventional semiconductor apparatus.

Referring to FIG. 1, a semiconductor apparatus 10 includes sense amplifiers 11 and 12 which sense and amplify the data of memory cell regions and transmit the amplified data on pairs of local transmission lines LIO and LIOB, and input/output sense amplifiers 13 and 14 which receive and amplify the data loaded on the pairs of local transmission lines LIO and LIOB transmit the amplified data to global transmission lines GIO.

The input/output sense amplifiers 13 and 14 amplify the voltage differences of the signals loaded on the pairs of local transmission lines LIO and LIOB in response to a strobe signal IOSTRB, and transmit the amplified voltage differences to the global transmission lines GIO. The conventional semiconductor apparatus includes a plurality of input/output sense amplifiers 13 and 14, which operate for the same time in response to the strobe signal IOSTRB. If the voltage difference of the signals loaded on the pair of local transmission lines LIO and LIOB connected to any one of the plurality of input/output sense amplifiers 13 and 14 is small, the other input/output sense amplifiers continue sensing and amplifying the voltage difference until complete. If the voltage difference of the signals loaded on the pair of local transmission lines LIO and LIOB is large, the current consumption of the input/output sense amplifiers 13 and 14 is large, which is not ideal.

SUMMARY

In an embodiment of the present invention, an input/output sense amplifier is configured to amplify data inputted through a pair of local transmission lines in response to a sense amplifier enable signal and a test mode signal, output the data through a global transmission line, generate a control signal by sensing whether the data have been amplified, and halt amplification of the data in response to the control signal when amplification is complete.

In another embodiment of the present invention, a semiconductor apparatus includes: a plurality of input/output sense amplifiers configured to amplify data inputted through pairs of local transmission lines and output the data through global transmission lines, wherein each input/output sense amplifier independently generates a control signal by sensing whether the data has been amplified, in response to a sense amplifier enable signal, and halts amplification of the data in response to the control signal when amplification is complete.

BRIEF DESCRIPTION OF THE DRAWINGS

Features, aspects, and embodiments are described in conjunction with the attached drawings, in which.

DETAILED DESCRIPTION

Hereinafter, an input/output sense amplifier and a semiconductor apparatus including the same according to the present invention will be described below with reference to the accompanying drawings through various embodiments.

Figure 1:
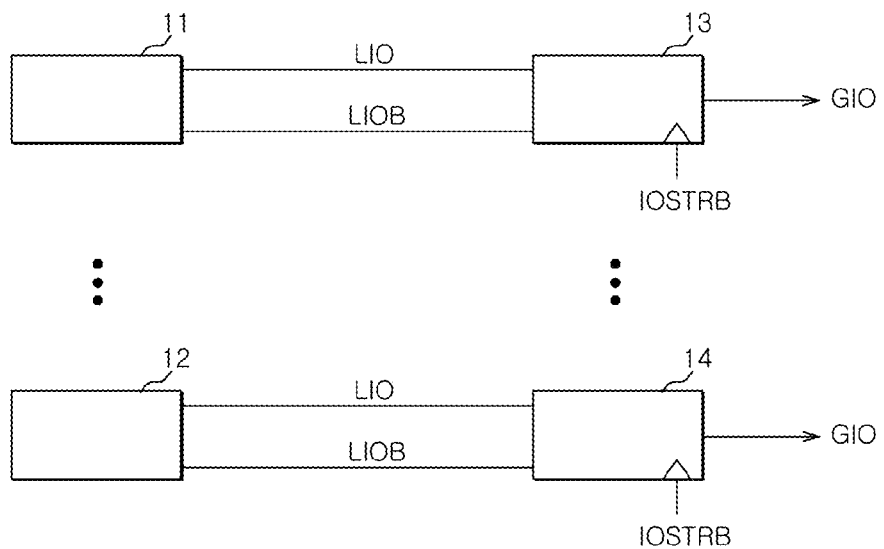
FIG. 1 is a configuration diagram of a conventional semiconductor apparatus.
Figure 2:
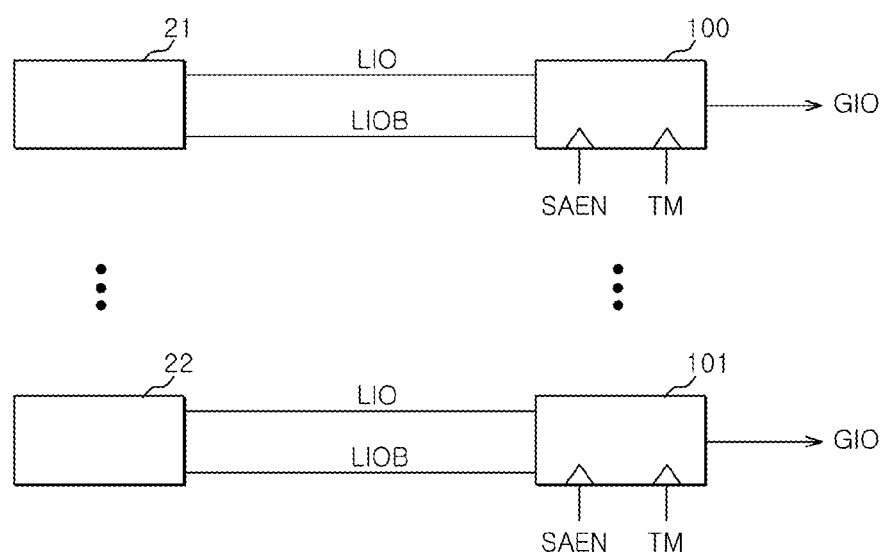
FIG. 2 is a configuration diagram of a semiconductor apparatus in accordance with an embodiment of the present invention.

FIG. 2 is a configuration diagram of a semiconductor apparatus 20 in accordance with an embodiment of the present to invention.

The semiconductor apparatus 20 in accordance with the embodiment of the present invention will be described below with reference to FIG. 2.

The semiconductor apparatus 20 includes a plurality of sense amplifiers 21 and 22 which sense and amplify the data of memory cell regions and transmit the amplified data to pairs of local transmission lines LIO and LIOB, and a plurality of input/output sense amplifiers 100 and 101 which receive and amplify the data loaded on the pairs of local transmission lines LIO and LIOB and transmit the amplified data to global transmission lines GIO.

Each of the plurality of input/output sense amplifiers 100 and 101 amplifies the data loaded on the pair of local transmission lines LIO and LIOB in response to a sense amplifier enable signal SAEN and a test mode signal TM, and transmits the amplified data to the global transmission line GIO. The plurality of input/output sense amplifiers 100 and 101 have similar configurations.

In the plurality of input/output sense amplifiers 13 and 14 of the conventional semiconductor apparatus 10, although any one input/output sense amplifier of the plurality of input/output sense amplifiers 13 and 14 completes amplification of the data loaded on the pair of local transmission lines LIO and LIOB, it continuously performs its operation until all input/output sense amplifiers, having completed amplification. However, in the semiconductor apparatus 20 in accordance with an embodiment of the present invention, if any one input/output sense amplifier of the plurality of input/output sense amplifiers 100 and 101 completes amplification of the data loaded on the pair of local transmission lines LIO and LIOB, it transmits the data to the global transmission line GIO, ends the amplification operation, and does not continuously perform its operation until all input/output is sense amplifiers have completed amplification.

Figure 3:
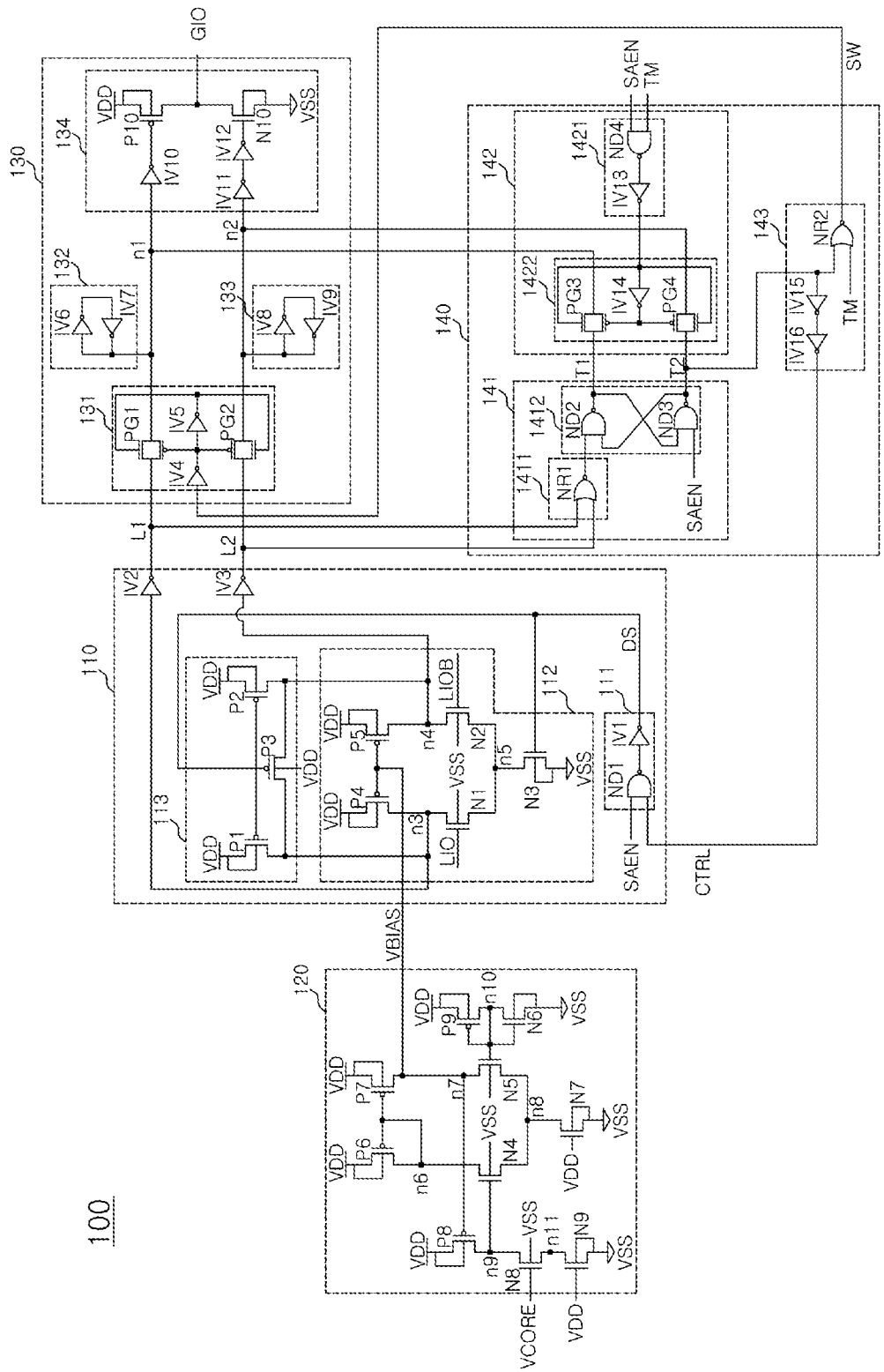
FIG. 3 is a circuit diagram of an input/output sense amplifier in accordance with another embodiment of the present invention.

FIG. 3 is a circuit diagram of the input/output sense amplifier 100 in accordance with another embodiment of the present invention, which includes a sense amplification block 110, a bias voltage block 120, an output block 130, and a control block 140.

The sense amplification block 110 includes a sense amplifier control unit 111, a differential amplification unit 112, and a precharge unit 113.

The output block 130 includes an output line switch unit 131, first and second latch units 132 and 133, and a driving unit 134.

The control block 140 includes a sensing unit 141, a test unit 142, and a control signal output unit 143. The sensing unit 141 includes a comparison determining section 1411 and a latch section 1412. The test unit 142 includes a test control section 1421 and a test line switching section 1422.

The sense amplifier control unit 111 includes a first NAND gate ND1 which executes a logic operation for the sense amplifier enable signal SAEN and a control signal CTRL, and a first inverter IV1 which inverts the output signal of the first NAND gate ND1. The sense amplifier control unit 111 generates a driving signal DS which is enabled when the sense amplifier enable signal SAEN is enabled and the control signal CTRL is inputted. The sense amplification block 110 starts an amplify operation in response to the driving signal DS which is enabled, amplifies the data inputted to the pair of local transmission lines LIO and LIOB, and outputs the amplified data to a first output line L1 and a second output line L2.

The differential amplification unit 112 includes a fourth PMOS transistor P4 connected between a driving voltage VDD and a third node n3 having a bulk terminal which receives the driving voltage VDD and a gate terminal which receives a bias voltage VBIAS, a fifth PMOS transistor P5 connected between the driving voltage VDD and a fourth node n4 having a bulk terminal which receives the driving voltage VDD and a gate terminal which receives the bias voltage VBIAS, a first NMOS transistor N1 connected between the third node n3 and a fifth node n5 having a bulk terminal which receives a ground voltage VSS and a gate terminal which receives the output signal of the first local transmission line LIO, a second NMOS transistor N2 connected between the fourth node n4 and the fifth node n5 having a bulk terminal which receives the ground voltage VSS and a gate terminal which receives the output signal of the second local transmission line LIOB, and a third NMOS transistor N3 connected between the fifth node n5 and the ground voltage VSS having a bulk terminal which receives the ground voltage VSS and a gate terminal which receives the output signal of the sense amplifier control unit 111.

The precharge unit 113 includes a first PMOS transistor P1 connected between the driving voltage VDD and the third node n3 having a bulk terminal which receives the driving voltage VDD and a gate terminal which receives the output signal of the sense amplifier control unit 111, a second PMOS transistor P2 connected between the driving voltage VDD and the fourth node n4 having a bulk terminal which receives the driving voltage VDD and a gate terminal which receives the output signal of the sense amplifier control unit 111, and a third PMOS transistor P3 connected between the third node n3 and the fourth node n4 having a bulk terminal which receives the driving voltage VDD and a gate terminal which receives the output signal of the sense amplifier control unit 111.

A second inverter IV2 of the sense amplification block 110 inverts the output signal of the third node n3 and outputs the inverted output signal to the first output line L1, and a third inverter IV3 of the sense amplification block 110 inverts the output signal of the fourth node n4 and outputs the inverted output signal to the second output line L2.

The bias voltage block 120 includes a sixth PMOS transistor P6 connected between the driving voltage VDD and a sixth node n6 having a bulk terminal which receives the driving voltage VDD and a gate terminal which receives the output signal of the sixth node n6, a seventh PMOS transistor P7 connected between the driving voltage VDD and a seventh node n7 having a bulk terminal which receives the driving voltage VDD and a gate terminal which receives the output signal of the sixth node n6, a fourth NMOS transistor N4 connected between the sixth node n6 and an eighth node n8 having a bulk terminal which receives the ground voltage VSS and a gate terminal which receives the output signal of a ninth node n9, a fifth NMOS transistor N5 connected between the seventh node n7 and the eighth node n8 having a bulk terminal which receives the ground voltage VSS and a gate terminal which receives the output signal of a tenth node n10, a seventh NMOS transistor N7 connected between the eighth node n8 and the ground voltage VSS having a bulk terminal which receives the ground voltage VSS and a gate terminal which receives the driving voltage VDD, an eighth PMOS transistor P8 connected between the driving voltage VDD and the ninth node n9 having a bulk terminal which receives the driving voltage VDD and a gate terminal which receives the output signal of the seventh node n7, an eighth NMOS transistor N8 connected between the ninth node n9 and an eleventh node n11 having a bulk terminal which receives the ground voltage VSS and a gate terminal which receives a core voltage VCORE, a ninth NMOS transistor N9 connected between the eleventh node n11 and the ground voltage VSS having a bulk terminal which receives the ground voltage VSS and a gate terminal which receives the driving voltage VDD, a ninth PMOS transistor P9 connected between the driving voltage VDD and the tenth node n10 having a bulk terminal which receives the driving voltage VDD and a gate terminal which receives the output signal of the tenth node n10, and a sixth NMOS transistor N6 connected between the tenth node n10 and the ground voltage VSS having a bulk terminal which receives the ground voltage VSS and a gate terminal which receives the output signal of the tenth node n10.

The bias voltage block 120 supplies a bias voltage VBIAS as the voltage of the seventh node n7 to the sense amplification block 110 in response to the core voltage VCORE and the driving voltage VDD. The ninth PMOS transistor P9 and the sixth NMOS transistor N6 of the bias voltage block 120 turn the fifth NMOS transistor N5 on or off. If the fifth NMOS transistor N5 is turned on, the voltage of the seventh node n7 is pulled down and the bias voltage VBIAS with a logic low level is generated. If the fifth NMOS transistor N5 is turned off, the bias voltage block 120 does not generate the bias voltage VBIAS. The bias voltage block 120 only supplies the bias voltage VBIAS of the logic low level to the sense amplification block 110.

In the output block 130, the output line switch unit 131 includes a fourth inverter IV4 which inverts a switching signal SW, a fifth inverter IV5 which inverts the output signal of the fourth inverter IV4, a first pass gate PG1 which transfers the output signal of the first output line L1 to the driving unit 134 in response to the output signals of the fourth inverter IV4 and the fifth inverter IV5, and a second pass gate PG2 which transfers the output signal of the second output line L2 to the driving unit 134 in response to the output signals of the fourth inverter IV4 and the fifth inverter IV5.

The first latch unit 132 includes a sixth inverter IV6 which inverts the signal of the first output line L1 and a seventh inverter IV7 which inverts the output signal of the sixth inverter IV6 and outputs a resultant signal to the first output line L1.

The second latch unit 133 includes an eighth inverter IV8 which inverts the signal of the second output line L2 and a ninth inverter IV9 which inverts the output signal of the eighth inverter IV8 and outputs a resultant signal to the second output line L2.

The driving unit 134 includes a tenth inverter IV10 which inverts the signal of the first output line L1, an eleventh inverter IV11 which inverts the signal of the second output line L2, a twelfth inverter IV12 which inverts the output signal of the eleventh inverter IV11, a tenth PMOS transistor P10 connected between the driving voltage VDD and the global transmission line GIO having a bulk terminal which receives the driving voltage VDD and a gate terminal which receives the output signal of the tenth inverter IV10, and a tenth NMOS transistor N10 connected between the global transmission line GIO and the ground voltage VSS having a bulk terminal which receives the ground voltage VSS and a gate terminal which receives the output signal of the twelfth inverter IV12.

The output line switch unit 131 determines whether to transmit the signals of the first output line L1 and the second output line L2 to the first latch unit 132, the second latch unit 133 and the driving unit 134, in response to the switching signal SW.

If the sense amplification block 110 amplifies the signals of the pair of local transmission lines LIO and LIOB and transmits signals to the first output line L1 and the second output line L2, the control block 140 controls the sense amplification block 110 and the output block 130 using the control signal CTRL and the switch signal SW. Namely, if the sense amplification block 110 amplifies the signals of the pair of local transmission lines LIO and LIOB and transmits signals to the first output line L1 and the second output line L2, the control signal CTRL causes the sense amplification block 110 to halt amplifying the output signals of the pair of local transmission lines LIO and LIOB, and the switch signal SW allows the output block 130 to latch the signals transmitted through the first and second output lines L1 and L2 so as to transmit the latched signals through the global transmission line GIO.

The output line switch unit 131 opens the first and second pass gates PG1 and PG2 which are connected to the first and second output lines L1 and L2, in response to an enable switch signal SW, and transmits the signals of the first and second output lines L1 and L2 to the first and second latch units 132 and 133 and the driving unit 134.

The first latch unit 132 stores the signal of the first output line L1 and the second latch unit 133 stores the signal of the second output line L2.

The driving unit 134 transmits the signal of the first output line L1 or the second output line L2 to the global transmission line GIO when it is inputted thereto. If the output signal of the first output line L1 has a logic high level, the signal outputted from the tenth inverter IV10 has a logic low level, and the tenth PMOS transistor P10 which receives the output of the tenth inverter IV10 of the logic low level is turned on and outputs a signal of a logic high level through the global transmission line GIO. If the output signal of the second output line L2 has a logic high level, the signal outputted from the twelfth inverter IV12 has a logic high level, and the tenth NMOS transistor N10 which receives the output of the twelfth inverter IV12 of the logic high level is turned on and outputs a signal of a logic low level through the global transmission line GIO.

In the control block 140, the sensing unit 141 includes the comparison determining section 1411 and the latch section 1412.

The comparison determining section 1411 may be constituted by a first NOR gate NR1 which executes a logic operation for the signals of the first output line L1 and the second output line L2. The comparison determining section 1411 compares the signals of the first output line L1 and the second output line L2 and determines whether the sense amplification block 110 has amplified the signals transmitted through the pair of local transmission lines LIO and LIOB. If a signal is not transferred through the pair of local transmission lines LIO and LIOB, the sense amplification block 110 outputs signals with logic high levels to the third node n3 and the fourth node n4. The second inverter IV2 and the third inverter IV3 invert the signals of the third node n3 and the fourth node n4, respectively, and outputs signals with logic low levels to the first and second output lines L1 and L2. The comparison determining section 1411 outputs a signal with a logic high level in response to the signals of the first and second output lines L1 and L2 which have the logic low levels. However, if the sense amplification block 110 amplifies the signals transferred through the pair of local transmission lines LIO and LIOB, the logic levels of both signals outputted through the first and second output lines L1 and L2 are different from each other, in which case is the comparison determining section 1411 determines that the sense amplification block 110 has amplified the signals transferred through the pair of local transmission lines LIO and LIOB, and outputs a low level logic signal.

The latch section 1412 includes a second NAND gate ND2 which executes a logic operation for the output signal of the first NOR gate NR1 and the output signal of a second test line T2 and outputs a resultant signal to a first test line T1, and a third NAND gate ND3 which executes a logic operation for the sense amplifier enable signal SAEN and the output signal of the first test line T1 and outputs a resultant signal to the second test line T2.

The test unit 142 includes the test control section 1421 and the test line switching section 1422.

The test control section 1421 includes a fourth NAND gate ND4 which executes a logic operation for the sense amplifier enable signal SAEN and the test mode signal TM, and a thirteenth inverter IV13 which inverts the output signal of the fourth NAND gate ND4.

The test line switching section 1422 includes a fourteenth inverter IV14 which inverts the output signal of the thirteenth inverter IV13, a third pass gate PG3 which determines whether to transfer the output signal of the first test line T1 to the first node n1 of the output block 130, in response to the output signal of the thirteenth inverter IV13 and the output signal of the fourteenth inverter IV14, and a fourth pass gate PG4 which determines whether to transfer the output signal of the second test line T2 to the second node n2 of the output block 130, in response to the output signal of the thirteenth inverter IV13 and the output signal of the fourteenth inverter IV14.

The control signal output unit 143 includes a second NOR gate NR2 which executes a logic operation for the output signal of the second test line T2 and the test mode signal TM and generates the switch signal SW, and fifteenth and sixteenth inverters IV15 and IV16 which buffer the output signal of the second test line T2 and output the buffered signal.

The latch section 1412 outputs signals to the first test line T1 and the second test line T2 in response to the sense amplifier enable signal SAEN and the output signal of the comparison determining section 1411. When starting a read operation, the semiconductor apparatus enables the sense amplifier enable signal SAEN and activates the input/output sense amplifier 100. In an embodiment of the present invention, the enable level of the sense amplifier enable signal SAEN is a logic high level, and the disable level of the sense amplifier enable signal SAEN is a logic low level. The sense amplifier enable signal SAEN which is enabled by an active command when a semiconductor apparatus performs a read operation is an initial signal to control the driving of a sense amplifier, which is generally known in the art.

Operations of the input/output sense amplifier 100 in accordance with an embodiment of the present invention when the test mode signal TM is in a disabled state thereby performing a is normal operation will be described below. The test mode signal TM is enabled to a logic high level when the semiconductor apparatus is in a test mode and is disabled to a logic low level when the semiconductor apparatus performs a normal operation. When the test mode signal TM is disabled, the test unit 142 prevents the output signals of the first test line T1 and the second test line T2 from being transferred to the first node n1 and the second node n2 of the output block 130.

When the sense amplifier enable signal SAEN is in the disabled state, the sense amplifier control unit 111 outputs a disabled driving signal DS. In an embodiment of the present invention, the enable level of the driving signal DS is a logic high level, and the disable level of the driving signal DS is a logic low level.

The sense amplification block 110 does not amplify the output signals of the pair of local transmission lines LIO and LIOB in response to the disabled driving signal DS and the bias voltage VBIAS, and outputs the signals of the same voltage to the third node n3 and the fourth node n4.

The comparison determining section 1411 outputs a comparison determination signal based on the logic levels of the signals outputted from the first and second output lines L1 and L2, and generates a signal of a logic high level through the first NOR gate NR1 only when both first and second output lines L1 and L2 have logic low levels. The latch section 1412 receives the output signal of the first NOR gate NR1 with the logic high level and the sense amplifier enable signal SAEN with the logic low level, and outputs a signal of a logic high level to the second test line T2. The control signal output unit 143 receives the signal of the second test line T2 with the logic high level and the test mode signal TM with the logic low level, and generates the switch signal with a logic low level and the control signal CTRL with a logic high level.

In other words, the control block 140 enables the control signal CTRL and disables the switch signal SW when the disabled sense amplifier enable signal SAEN is inputted thereto.

If the sense amplifier enable signal SAEN is enabled, the control block 140 maintains the enabled state of the control signal CTRL and the disabled state of the switch signal SW for a predetermined time. When the output signal of the comparison determining section 1411 is changed, the control block 140 correspondingly changes the states of the control signal CTRL and the switch signal SW.

The sense amplifier control unit 111 enables the driving signal DS in response to the enabled sense amplifier enable signal SAEN and the enabled control signal CTRL. The sense amplification block 110 amplifies the signals transmitted through the pair of local transmission lines LIO and LIOB in response to the enabled driving signal DS and transmits the amplified signals to the first output line L1 and the second output line L2. The signals transmitted to the first output line L1 and the second output line L2 may have different logic levels or different voltage levels. The comparison determining section 1411 outputs a low logic level comparison determination signal when the signals of the first output line L1 and the second output line L2 have different logic levels. The latch section 1412 receives the output signal of the first NOR gate NR1 with the logic low level and the sense amplifier enable signal SAEN with the logic high level, and outputs a signal of a logic high level to the first test line T1 and a signal of a logic low level to the second test line T2. The control signal output unit 143 generates the switch signal with a logic high level and the control signal CTRL with a logic low level in response to the signal of the second test line T2 with the logic low level and the test mode signal TM with the logic low level.

In other words, in the state in which the test mode signal TM is disabled during a normal operation, if the sense amplification block 110 completes the amplification of the signals inputted through the pair of local transmission lines LIO and LIOB, the control block 140 disables the control signal CTRL and enables the switch signal SW.

The sense amplification block 110 halts the amplification of the signals transmitted through the pair of local transmission lines LIO and LIOB, in response to the disabled control signal CTRL. The output block 130 latches the signals of the first output line L1 and the second output line L2 with the first latch unit 132 and the second latch unit 133 in response to the enabled switch signal SW, and outputs the latched signals to the global transmission line GIO through the driving unit 134.

When the control signal CTRL is disabled, the sense amplifier control unit 111 disables the driving signal DS in response to the disabled control signal CTRL. The sense amplification block 110 halts the amplification of the signals transmitted through the pair of local transmission lines LIO and LIOB, in response to the disabled driving signal DS, and transmits signals with the same logic level or the same voltage level to the first output line L1 and the second output line L2.

The comparison determining section 1411 outputs the comparison determination signal when the logic levels or the voltages of the signals outputted from the first output line L1 and the second output line L2 are the same, and the control block 140 maintains the disabled state of the control signal CTRL and the enabled state of the switch signal SW in response to the signal of the comparison determining section 1411. The output block 130 latches the signals of the first output line L1 and the second output line L2 with the first latch unit 132 and the second latch unit 133 in response to the enabled switch signal SW, and outputs the latched signals to the global transmission line GIO through the driving unit 134. Accordingly, when the amplification of the signals transmitted through the pair of local transmission lines LIO and LIOB is complete, the input/output sense amplifier 100 halts the amplification of the signals in response to the control signal CTRL. The amplified signals are stored in the first and second latch units 132 and 133 and subsequently outputted.

Operations of the input/output sense amplifier 100 in accordance with an embodiment of the present invention when the test mode signal TM is in an enabled state for a test operation, will be described below.

The control signal output unit 143 disables the switch signal SW when the test mode signal TM is enabled, in which case the output line switch unit 131 blocks the signals of the first output line L1 and the second output line L2 from being transferred to the output block 130.

The test unit 142 transfers the output signal of the first test line T1 and the second test line T2 to the first node n1 and the second node n2 of the output block 130 in response to the test mode signal TM and the sense amplifier enable signal SAEN. The test control section 1421 executes a logic operation for the test mode signal TM and the sense amplifier enable signal SAEN and generates a signal to control the test line switching section 1422. The test control section 1421 allows the test line switching section 1422 to transmit the output signals of the first test line T1 and the second test line T2 to the first node n1 and the second node n2, when the test mode signal TM and the sense amplifier enable signal SAEN are to enabled.

The sense amplification block 110 amplifies the signals inputted through the pair of local transmission lines LIO and LIOB when the control signal CTRL and the sense amplifier enable signal SAEN are inputted at logic high levels in the test operation, and outputs the amplified signals to the first output line L1 and the second output line L2. The comparison determining section 1411 senses that the sense amplification block 110 has amplified the signals and outputs the comparison determination signal. The latch section 1412 outputs signals with specified logic levels to the first test line T1 and the second test line T2 in response to the output signal of the comparison determining section 1411 and the sense amplifier enable signal SAEN.

In other words, if the control signal CTRL and the sense amplifier enable signal SAEN are enabled, the signal outputted from the sense amplification block 110 is transferred to the output block 130 through the control block 140 and is outputted on the global transmission line GIO.

In another embodiment of the present invention, a case where a semiconductor apparatus does not perform a test operation and performs only a normal operation will be described below.

When the semiconductor apparatus performs only the normal operation, the test unit 142 is not included. The first test line T1 is not connected to the test unit 142 and the first node n1, and the second test line T2 is not connected to the test unit 142 and the second node n2.

The second NOR gate NR2 of the control signal output unit 143 is replaced with an inverter which inverts the output signal of the second test line T2 and generates the switch signal SW. In other words, the control signal output unit 143 does not receive the test is mode signal TM, and receives the output signal of the second test line T2 and generates the control signal CTRL and the switch signal SW.

While certain embodiments have been described above, it will be understood to those skilled in the art that the embodiments described are by way of example only. Accordingly, the input/output sense amplifier and the semiconductor apparatus including the same described herein should not be limited based on the described embodiments. Rather, the input/output sense amplifier and the semiconductor apparatus including the same described herein should only be limited in light of the claims that follow when taken in conjunction with the above description and accompanying drawings.

What is claimed is:

1. An input/output sense amplifier configured to amplify data inputted through a pair of local transmission lines in response to a sense amplifier enable signal and a test mode signal, output the data through a global transmission line, generate a control signal by sensing whether the data have been amplified, and halt amplification of the data in response to the control signal when amplification is complete, wherein the input/output sense amplifier comprises:
   a sense amplification block configured to amplify the data inputted through the pair of local transmission lines in response to the sense amplifier enable signal and the control signal, and transmit the data to first and second output lines;
   a control block configured to determine whether the data received through the first and second output lines have been amplified, in response to the sense amplifier enable signal and the test mode signal, and to generate a switch signal and the control signal; and
   an output block connected with the control block through first and second test lines, and configured to output the data transmitted from the first and second output lines to the global transmission line, in response to the switch signal.

2. The input/output sense amplifier according to claim 1, wherein the input/output sense amplifier further comprises:
   a bias voltage block configured to supply a bias voltage to the sense amplification block by using a core voltage and a driving voltage.

3. The input/output sense amplifier according to claim 1, wherein the sense amplification block comprises:
   a sense amplifier control unit configured to generate a driving signal in response to the sense amplifier enable signal and the control signal;
   a differential amplification unit configured to amplify the data inputted through the pair of local transmission lines, in response to the driving signal; and
   a precharge unit configured to supply a precharge voltage to the differential amplification unit in response to the driving signal.

4. The input/output sense amplifier according to claim 3, wherein the sense amplification block amplifies the data inputted through the pair of local transmission lines when the sense amplifier enable signal and the control signal are enabled, and outputs the data with a different voltage level to the first and second output lines, respectively.

5. The input/output sense amplifier according to claim 3, wherein the sense amplification block outputs the data with a same voltage level to the first and second output lines, respectively, when any one of the sense amplifier enable signal and the control signal is disabled.

6. The input/output sense amplifier according to claim 1, wherein the control block comprises:
   a sensing unit configured to determine whether the data received through the first and second output lines have been amplified, and to output a determination result to the first and second test lines;
   a test unit configured to determine whether to transfer output signals of the first and second test lines to the output block, in response to the sense amplifier enable signal and the test mode signal; and
   a control signal output unit configured to generate the switch signal and the control signal in response to the test mode signal and the output signal of the second test line.

7. The input/output sense amplifier according to claim 6, wherein the sensing unit comprises:
   a comparison determining section configured to compare the data received through the first and second output lines, and determine whether to amplify the data; and
   a latch section configured to output signals notifying whether amplification has occurred to the first and second test lines in response to an output signal of the comparison determining section and the sense amplifier enable signal.

8. The input/output sense amplifier according to claim 7, wherein the sensing unit outputs a signal notifying completion of amplification to the second test line in response to the enabled sense amplifier enable signal when the sense amplification block amplifies the data inputted through the pair of local transmission lines and outputs the data with a different voltage to the first and second output lines, respectively.

9. The input/output sense amplifier according to claim 6, wherein the control signal output unit buffers the output signal of the second test line and outputs the control signal, and outputs the switch signal in response to the output signal of the second test line and the test mode signal.

10. The input/output sense amplifier according to claim 9, wherein the control signal output unit outputs a disabled control signal, when the signal notifying completion of amplification is outputted to the second test line in response to the enabled sense amplifier enable signal when the sense amplification block amplifies the data inputted through the pair of local transmission lines and outputs the data with a voltage different to the first and second output lines, respectively.

11. The input/output sense amplifier according to claim 6, wherein the control signal output unit outputs a disabled switch signal, regardless of the output signal of the second test line, when an enabled test mode signal is inputted.

12. The input/output sense amplifier according to claim 6, wherein the control signal output unit outputs the enabled switch signal which, when a disabled test mode signal and the signal which notifies completion of amplification to the second test line are inputted.

13. The input/output sense amplifier according to claim 6, wherein the test unit comprises:
    a test line switching section configured to determine whether to transmit the output signals of the first and second test lines to the output block; and
    a test control section configured to control the test line switching section in response to the sense amplifier enable signal and the test mode signal.

14. The input/output sense amplifier according to claim 13, wherein the test line switching section transmits the output signals of the first and second test lines to the output block when the test mode signal and the sense amplifier enable signal are enabled.

15. The input/output sense amplifier according to claim 1, wherein the output block comprises:
    an output line switch unit configured to determine whether to transfer the data transmitted from the first and second output lines to the output block, in response to the switch signal;
    a first latch unit configured to latch the output signals of the first output line and the first test line;
    a second latch unit configured to latch the output signals of the second output line and the second test line; and
    a driving unit configured to drive the output signals of the first and second output lines and the first and second test lines, and output resultant signals to the global transmission line.

16. The input/output sense amplifier according to claim 15, wherein the output block drives the output signals of the first and second test lines and outputs resultant signals to the global transmission line when the test mode signal is enabled.

17. The input/output sense amplifier according to claim 15, wherein the output block drives the output signals of the first and second output lines and outputs resultant signals to the global transmission line when the test mode signal is disabled.

18. A semiconductor apparatus comprising:
    a plurality of input/output sense amplifiers configured to amplify data inputted through pairs of local transmission lines and output the data through global transmission lines,
    wherein each input/output sense amplifier independently generates a control signal by sensing whether the data have been amplified, in response to a sense amplifier enable signal, and halts amplification of the data in response to the control signal when amplification is complete,
    wherein each of the plurality of input/output sense amplifiers comprises:
    a sense amplification block configured to amplify the data inputted through the pair of local transmission lines in response to the sense amplifier enable signal and the control signal, and transmit the data to first and second output lines;
    a control block configured to determine whether the data received through the first and second output lines have been amplified, in response to the sense amplifier enable signal, and to generate a switch signal and the control signal; and
    an output block configured to output the data transmitted from the first and second output lines to the global transmission line, in response to the switch signal.

19. The semiconductor apparatus according to claim 18, wherein each of the plurality of input/output sense amplifiers further comprises:
    a bias voltage block configured to supply a bias voltage to the sense amplification block by using a core voltage and a driving voltage.

20. The semiconductor apparatus according to claim 18, wherein the sense amplification block comprises:
    a sense amplifier control unit configured to generate a driving signal in response to the sense amplifier enable signal and the control signal;
    a differential amplification unit configured to amplify the data inputted through the pair of local transmission lines, in response to the driving signal; and
    a precharge unit configured to supply a precharge voltage to the differential amplification unit in response to the driving signal.

21. The semiconductor apparatus according to claim 20, wherein the sense amplification block amplifies the data inputted through the pair of local transmission lines when the sense amplifier enable signal and the control signal are enabled, and outputs the data with a different voltage level to the first and second output lines, respectively.

22. The semiconductor apparatus according to claim 20, wherein the sense amplification block outputs the data with a same voltage level to the first and second output lines, respectively, when any one of the sense amplifier enable signal and the control signal is disabled.

23. The semiconductor apparatus according to claim 18, wherein the control block comprises:
    a sensing unit configured to determine whether the data received through the first and second output lines have been amplified, and to output a determination result to the first and second test lines; and
    a control signal output unit configured to generate the switch signal and the control signal in response to the output signal of the second test line.

24. The semiconductor apparatus according to claim 23, wherein the sensing unit comprises:
- a comparison determining section configured to compare the data received through the first and second output lines, and determine whether to amplify the data; and
- a latch section configured to output signals notifying whether amplification has occurred to the first and second test lines in response to an output signal of the comparison determining section and the sense amplifier enable signal.

25. The semiconductor apparatus according to claim 24, wherein the sensing unit outputs a signal notifying completion of amplification to the second test line in response to the enabled sense amplifier enable signal when the sense amplification block amplifies the data inputted through the pair of local transmission lines and outputs the data with a different voltage to the first and second output lines, respectively.

26. The semiconductor apparatus according to claim 23, wherein the control signal output unit buffers the output signal of the second test line and outputs the control signal, and outputs the switch signal by inverting the output signal of the second test line.

27. The semiconductor apparatus according to claim 26, wherein the control signal output unit outputs a disabled control signal, when the signal notifying completion of amplification is outputted to the second test line in response to the enabled sense amplifier enable signal when the sense amplification block amplifies the data inputted through the pair of local transmission lines and outputs the data with a voltage different to the first and second output lines, respectively.

28. The semiconductor apparatus according to claim 23, wherein the control signal output unit outputs a disabled switch signal, regardless of the output signal of the second test line, when an enabled test mode signal is inputted.

29. The semiconductor apparatus according to claim 24, wherein the control signal output unit outputs the enabled switch signal which, when a disabled test mode signal and the signal which notifies completion of amplification to the second test line are inputted.

30. The semiconductor apparatus according to claim 18, wherein the output block comprises:
- an output line switch unit configured to determine whether to transfer the data transmitted from the first and second output lines to the output block, in response to the switch signal;
- a first latch unit configured to latch the output signal of the first output line;
- a second latch unit configured to latch the output signal of the second output line; and
- a driving unit configured to drive the output signals of the first and second output lines, and output resultant signals to the global transmission line.

31. The semiconductor apparatus according to claim 30, wherein the output block drives the output signals of the first and second output lines and outputs resultant signals to the global transmission line when the switch signal is enabled.

* * * * *